United States Patent
Liu

(12) 
(10) Patent No.: US 10,505,564 B2
(45) Date of Patent: Dec. 10, 2019

(54) TOUCH KEYPAD WITH KEY SCANNING

(71) Applicant: TEXAS INSTRUMENTS INCORPORATED, Dallas, TX (US)

(72) Inventor: Dongtai Liu, Freemont, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/015,118

(22) Filed: Feb. 3, 2016

(65) Prior Publication Data

US 2016/0226521 A1   Aug. 4, 2016

Related U.S. Application Data

(60) Provisional application No. 62/111,116, filed on Feb. 3, 2015.

(51) Int. Cl.
| | |
|---|---|
| *H03K 17/98* | (2006.01) |
| *H03M 11/20* | (2006.01) |
| *H03K 17/96* | (2006.01) |
| *H03K 17/975* | (2006.01) |

(52) U.S. Cl.
CPC .......... *H03M 11/20* (2013.01); *H03K 17/962* (2013.01); *H03K 17/975* (2013.01); *H03K 17/9622* (2013.01); *H03K 17/98* (2013.01); *H03K 2217/94026* (2013.01)

(58) Field of Classification Search
CPC ........................... H03M 11/20; H03K 17/9622
USPC ............................................................. 341/24
See application file for complete search history.

(56) References Cited

U.S. PATENT DOCUMENTS

| | | | | |
|---|---|---|---|---|
| 4,733,222 A | * | 3/1988 | Evans | G06F 3/044 200/600 |
| 6,298,107 B1 | * | 10/2001 | Mullins | H03M 11/02 341/24 |
| 2014/0085263 A1 | * | 3/2014 | Yilmaz | G06F 3/044 345/174 |

* cited by examiner

*Primary Examiner* — Qutbuddin Ghulamali
(74) *Attorney, Agent, or Firm* — John R. Pessetto; Charles A. Brill; Frank D. Cimino

(57) ABSTRACT

Touch/key sensing with N-1 key scan averaging, for use with an N-key touch input apparatus, including a key matrix of N touch-key sense circuits, including: (a) continuously scanning the key matrix at a first bandwidth to determine a respective touch-key baseline sense signal, independent of a key-press condition, and a related touch-key baseline value based on successive baseline sense signals; and (b) during successive key-scan periods, scanning the key matrix at a second bandwidth greater than the first bandwidth, and for each touch key N, determining a touch-key sense signal, generating an N-1 key-scan average value by averaging the touch-key baseline values for the other N-1 touch keys, comparing the Nth touch-key sense signal to a key-press threshold based on the N-1 key-scan average value; and (c) signaling a key-press condition if the touch-key sense signal is greater in magnitude than the N-1 key-scan average value by the key-press threshold.

17 Claims, 4 Drawing Sheets

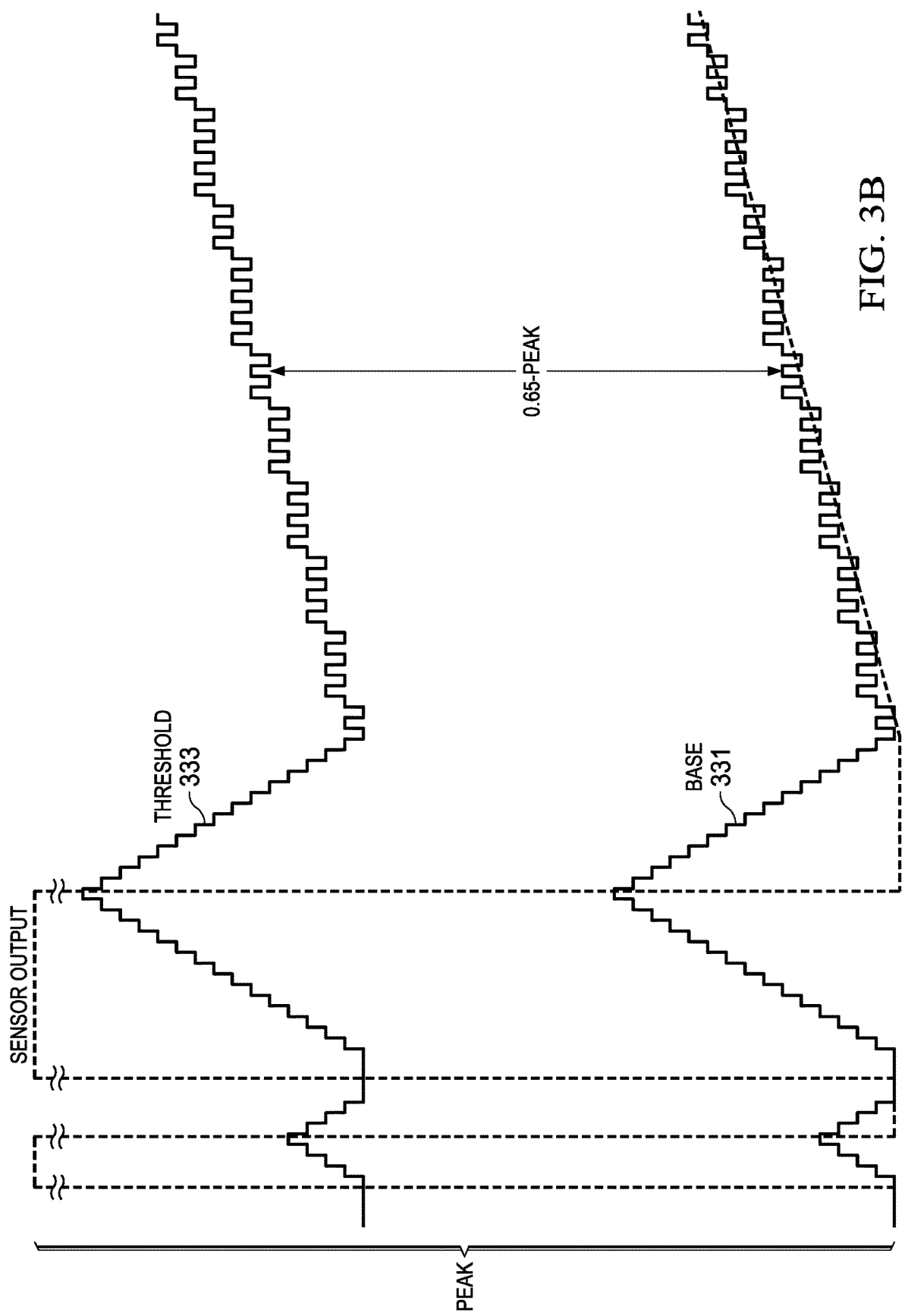

TOUCH KEYPAD WITH KEY SCANNING

CROSS-REFERENCE TO RELATED APPLICATIONS

Priority is claimed under 37 CFR 1.78 and 35 USC 119(e) to U.S. Provisional Application 62/111,116, filed 3 Feb. 2015), and 62/111,674, which are incorporated by reference.

BACKGROUND

Technical Field

This Patent Disclosure relates generally to touch-on-metal or touch-through-metal structures/devices, such as for keypads.

Related Art

Touch-on-metal or touch-through-metal (ToM) assemblies sense touch inputs based on deflection of a metal fascia/panel. Touch actuation force deflects the fascia/panel toward an underlying sensor.

As functionally illustrated in FIGS. 1A and 1B, a ToM assembly 10 includes a fascia/panel 12 as a touch surface, with one or more touch keys with defined touch/key areas 13, overlying and spaced from a PCB (printed circuit board) 14 that includes, for each touch key (touch/key area), a touch/key sense circuit 15. For example, touch sense can be based on inductive or capacitive sensing, implemented by a corresponding touch/key sense circuit.

Referring to FIG. 1B, a key-press condition is caused by a touch-press of the touch/key area 13 (touch key), which causes deflection/deformation of the fascia/panel [12A] on which the touch/key area 13 is defined. This deflection/deformation is detected by the touch-key sense circuit.

As an example application, a ToM keypad can include a metal panel with N defined touch/key areas, overlying a PCB with N associated touch-key sense circuits arranged in a touch/key matrix. When a touch/key area 13 of the panel is pressed (providing touch actuation force), the deflection of the panel is detected by the associated touch/key sense circuit.

Potential sources of key-press errors include human body capacitance, and adjacent metal (touch/press area) deflection.

While this Background information references a ToM keypad, the Disclosure in this Patent Document is more generally directed to touch-on-metal structures and devices.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

The Disclosure describes apparatus and methods for touch/key sensing with N-1 key scan averaging (with baseline drift compensation/normalization) for ToM apparatus, such as an example application for a ToM keypad.

According to aspects of the Disclosure, touch/key sensing with N-1 key scan averaging can be used with an N-key touch input apparatus, including a key matrix of N touch-key sense circuits. Touch/key sensing can include: (a) continuously scanning the key matrix at a first bandwidth to determine a respective touch-key baseline sense signal, independent of a key-press condition, and a related touch-key baseline value based on successive baseline sense signals; and (b) during successive key-scan periods, scanning the key matrix at a second bandwidth greater than the first bandwidth, and for each touch key N, determining a touch-key sense signal, generating an N-1 key-scan average value by averaging the touch-key baseline values for the other N-1 touch keys, comparing the Nth touch-key sense signal to a key-press threshold based on the N-1 key-scan average value; and (c) signaling a key-press condition if the touch-key sense signal is greater in magnitude than the N-1 key-scan average value by the key-press threshold. Touch-key baseline values can be determined by incrementing the touch-key baseline value if the touch-key sense signal is greater than the touch-key baseline value, decrementing the touch-key baseline value if the touch-key sense signal is less than the touch-key baseline value, and generating the normalized touch-key baseline value by subtracting the touch-key baseline value from the touch-key sense signal.

Other aspects and features of the invention claimed in this Patent Document will be apparent to those skilled in the art from the following Disclosure.

BRIEF DESCRIPTION OF THE DRAWINGS

FIG. 3B illustrates an example single-step increment/decrement process to track touch/key baseline values at a low bandwidth that does not track changes within a scan-period such as a key/press.

DETAILED DESCRIPTION

This Description and the Drawings constitute a Disclosure for touch/key sensing with N-1 key scan averaging (with baseline drift compensation/normalization) for ToM apparatus, including example embodiments that illustrate various technical features and advantages. The Disclosure for the N-1 key scan averaging technique (in various embodiments) is provided in the context of an example application of a ToM keypad. For this Disclosure, the term "key" is used to designate the touch/key area of a ToM apparatus, and the term "panel" is used to designate an overlying fascia or surface with defined touch/key areas for the ToM apparatus, corresponding to the example ToM keypad embodiment/application.

In brief overview, touch/key sensing with N-1 key scan averaging according to this disclosure can be used with an N-key touch input apparatus, including a key matrix of N touch-key sense circuits. Touch/key sensing can include: (a) continuously scanning the key matrix at a first bandwidth to determine a respective touch-key baseline sense signal, independent of a key-press condition, and a related touch-key baseline value based on successive baseline sense signals; and (b) during successive key-scan periods, scanning the key matrix at a second bandwidth greater than the first bandwidth, and for each touch key N, determining a touch-key sense signal, generating an N-1 key-scan average value by averaging the touch-key baseline values for the other N-1 touch keys, comparing the Nth touch-key sense signal to a key-press threshold based on the N-1 key-scan average value; and (c) signaling a key-press condition if the touch-key sense signal is greater in magnitude than the N-1 key-scan average value by the key-press threshold. Touch-key baseline values can be determined by incrementing the touch-key baseline value if the touch-key sense signal is greater than the touch-key baseline value, decrementing the touch-key baseline value if the touch-key sense signal is less than the touch-key baseline value, and generating the normalized touch-key baseline value by subtracting the touch-key baseline value from the touch-key sense signal.

That is, a touch-on-metal (touch-through-metal) keypad system includes N-1 key scan averaging to eliminate false key-press conditions due to human body capacitance and adjacent key metal deflection. During successive scan periods, for each Nth key, the other N-1 keys are scanned and averaged. Nth key-press is determined by comparing each Nth key with the corresponding N-1 key averages. Baseline normalization can be used to normalize for temperature drift by using a single-step increment/decrement technique during each scan period to generate for each Nth key a key baseline.

Figure 1A:
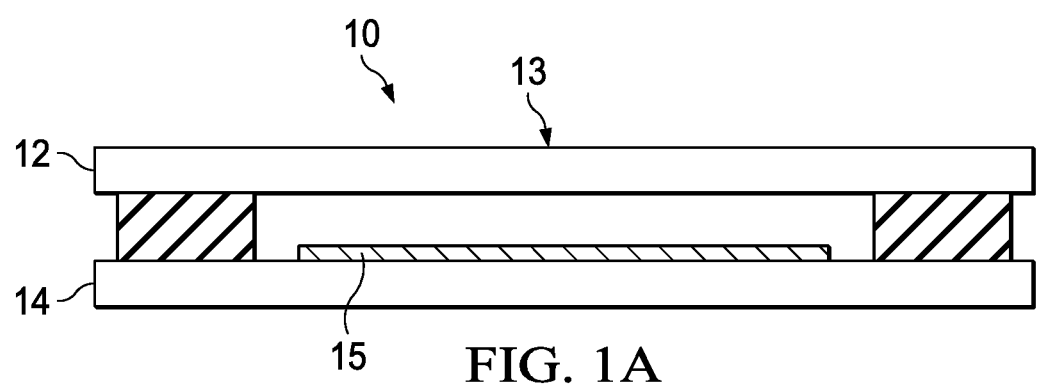
FIGS. 1A and 1B are example functional illustrations of a touch-on-metal (ToM) apparatus, in this example based on capacitive sensing, including illustrating in FIG. 1B a key-press condition causing deflection/deformation of a touch surface.
Figure 1B:
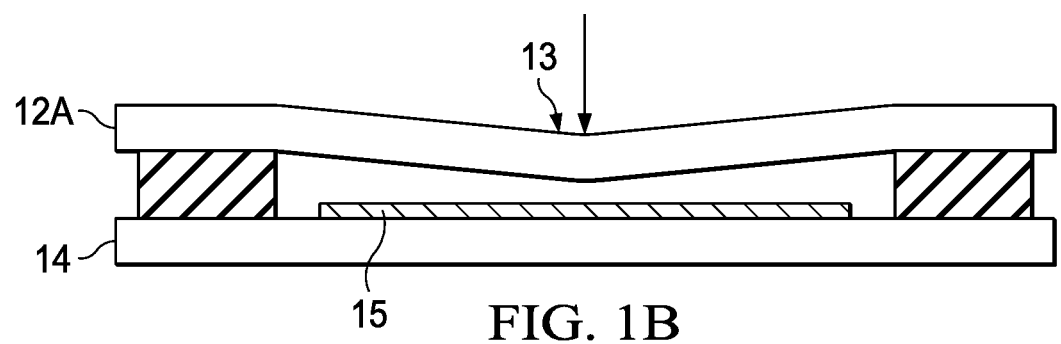
Figure 2:
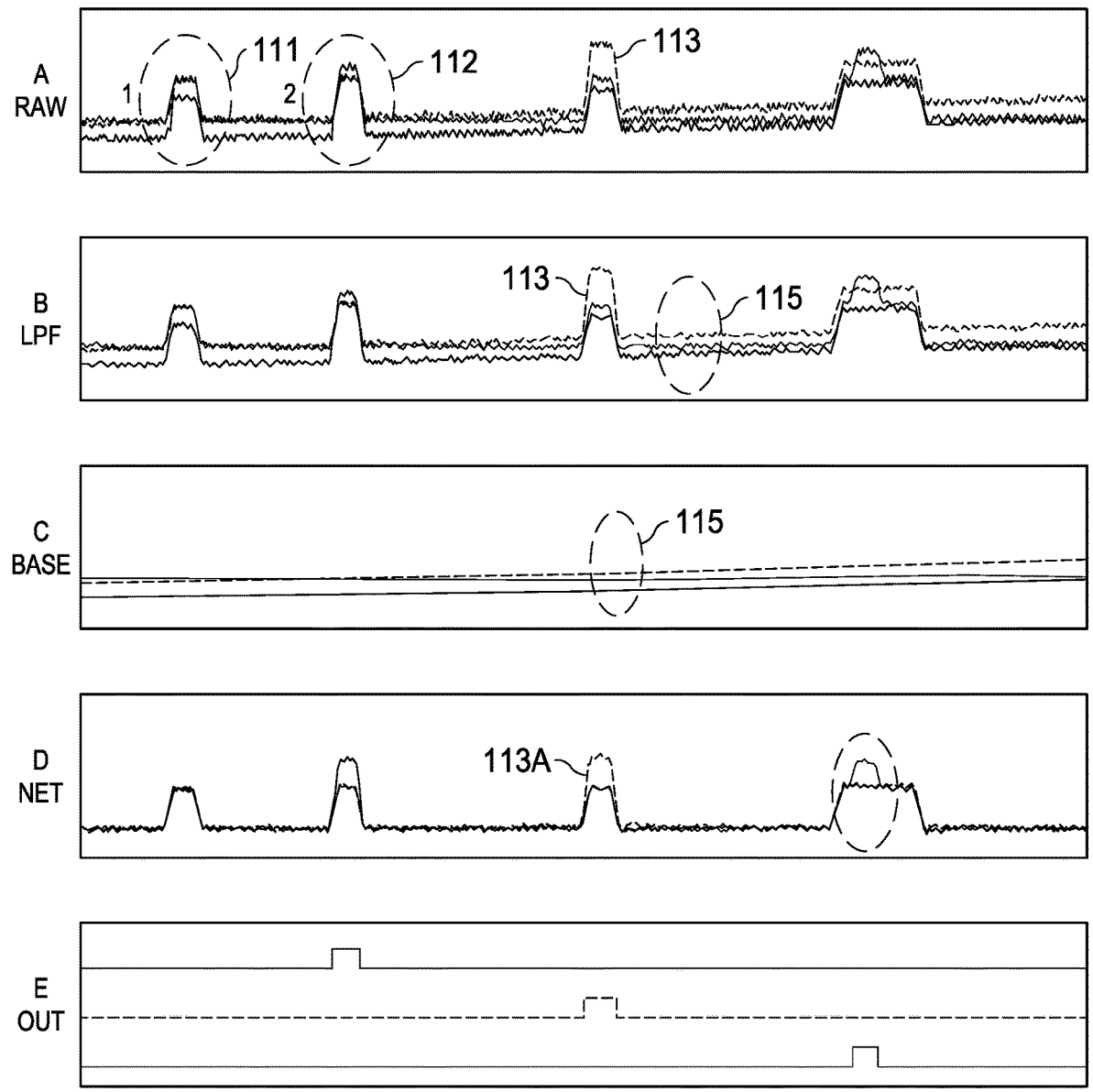
FIG. 2 provides example waveforms A-E that illustrate touch/key sensing with N-1 key scan averaging according to this Disclosure for an example ToM apparatus based on capacitive sensing: Waveform A illustrates the effects of human body capacitance on touch/key sensing for adjacent touch/keys [111, 112, 113], including a key-press signal [113]; Waveform B illustrates the effects of temperature drift on touch/key sense signals for the adjacent touch/keys; Waveform C illustrates the baseline sense signals [120] for the adjacent touch/keys; Waveform D illustrates a key-press signal [113] after suppressing baseline temperature drift, and canceling the effects of human body capacitance or adjacent key deflection based on N-1 key scan averaging; and Waveform E illustrates successive key scan periods FIGS. 3A and 3B provide example waveforms that illustrate N-1 key scan averaging, including baseline drift correction.

FIG. 2 provides example waveforms A-E that illustrate touch/key sensing with N-1 key scan averaging according to this Disclosure for an example ToM apparatus based on capacitive sensing. The example waveforms include touch/key sense signals 111, 112, 113 for adjacent touch keys, including a key-press condition 113, and including illustrating the effects of human body capacitance, and baseline temperature drift. For example, because ToM apparatus rely on relatively small metal deflection (touch/press actuation), signal/noise ratio can make key-press sensing/differentiation problematic. Noise sources can include human body capacitance, temperature drift and environmental electro-magnetic interference. Further, a key press can result in an adjacent key deflecting enough to cause a false key-press trigger. That is, when a finger touches the panel, signals from all keys can change due to human body capacitance, and the sensors for adjacent keys can also respond because metal deflection.

Waveform A illustrates, for an example ToM keypad based on capacitive sensing, the potential effects of human body capacitance on the touch/key signals 111, 112, 113 for adjacent touch keys. When the metal panel is touched, the increased body capacitance causes data of adjacent channels (touch keys and associated touch/key sense circuits) to change 111/112 independent of the change in capacitance caused by a key press 113. In addition, Waveform B illustrates the effects of temperature drift 115 on the touch/key sense signals.

As a result, key-press detection can be unreliable (sensed as a false key-press trigger).

Figure 3A:
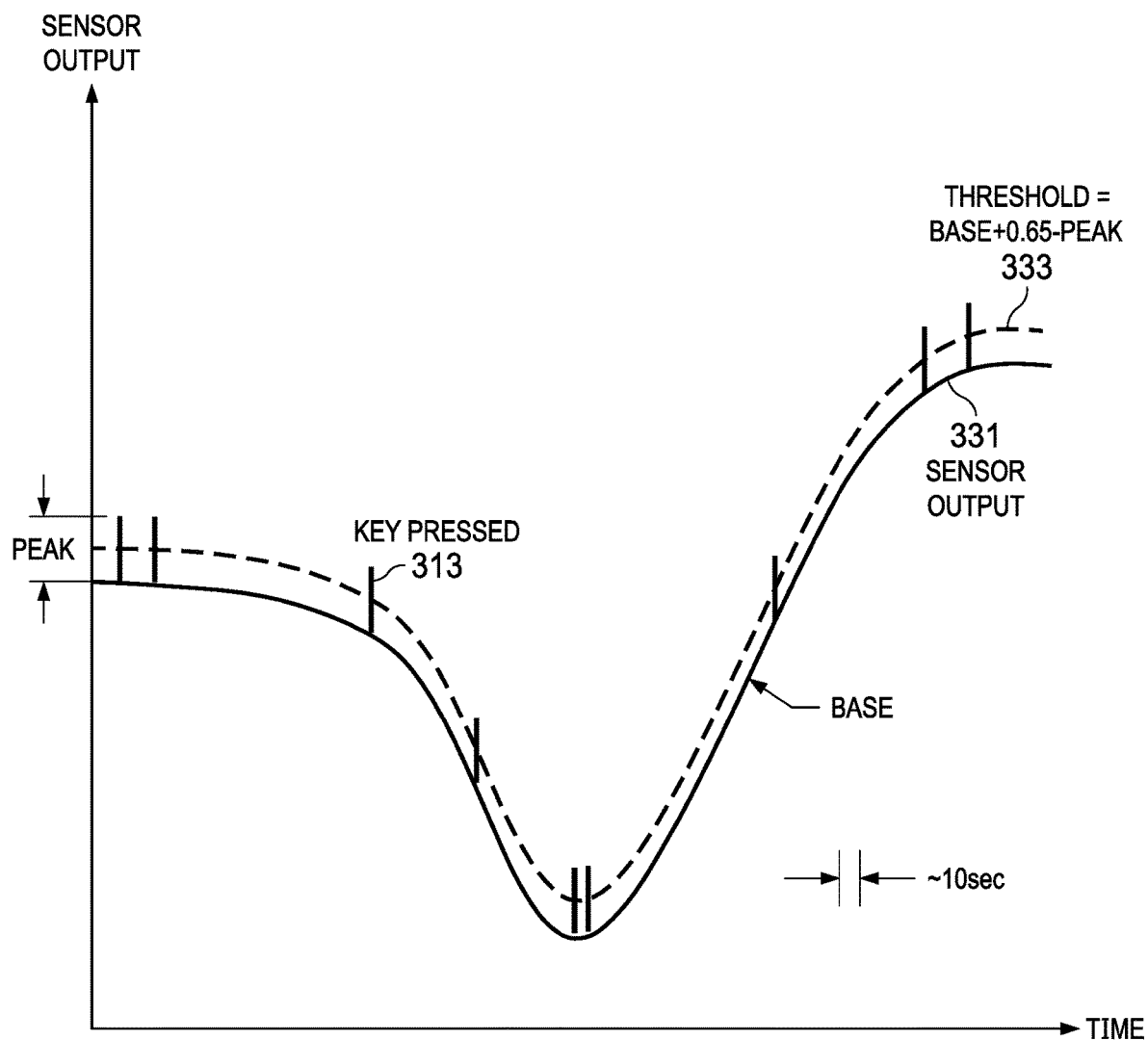
FIG. 3A illustrates sensing a key-press condition based on comparing the touch/key sense signal [313] to a key-press threshold value [333] based on the N-1 key-scan average value for the other N-1 touch keys.

FIGS. 3A and 3B provide example waveforms that illustrate N-1 key scan averaging, including baseline drift correction, according to this Disclosure. FIG. 3A illustrates sensing a key-press condition based on comparing the touch/key sense signal 313 to a key-press threshold value 333 based on the N-1 key-scan average value for the other N-1 touch keys. FIG. 3B illustrates an example single-step increment/decrement process to track touch/key baseline values at a low bandwidth that does not track changes within a scan-period such as a key/press Referring also to FIG. 2, the key matrix is continually scanned, and a baseline condition is acquired for each key. FIG. 2, Waveform C illustrates three baseline signals.

REFERRING to FIG. 3B, for the example embodiment, a single-step increment/decrement process tracks each key baseline at a low bandwidth. This baseline processing does not track changes within a scan-period, such as a key press.

As illustrated by FIG. 2, Waveform D, and FIG. 3A, according to touch/key sensing with the N-1 key scan averaging methodology of this Disclosure, during each key scan period, a key press determination is made by subtracting from the touch/key sense signal for each touch/key N, the average of the touch/key baseline signals 331 for the other N-1 keys. For a key-press, the result is illustrated in FIG. 2, Waveform D, 113A. That is, the resulting touch/key sense signal is the key-press signal without baseline temperature drift (FIG. 2, Waveform C), and with the effects of human body capacitance or adjacent key deflection canceled by the N-1 key scan averaging.

For each Nth key, during successive scan periods, the average of the other N-1 touch/key baseline signals (FIG. 3A, 331) is used as a reference, establishing a key-press threshold 333. For the example embodiment illustrated by FIG. 3A that threshold is: Threshold=Baseline+0.65*Peak. For sensor output to be detected as a key-press, the touch/key sense signal 313 output must exceed the Threshold based on N-1 key scan averaging according to this Disclosure.

For example, in the case of human body capacitance, the N-1 key scan averaging reference enables the detection of the net increase of the key signal, removing the human body effect. In the case of an adjacent key deflection, the signal processing for an adjacent key receives an N-1 key scan averaging reference that is higher than the reference received by the key that was pressed (higher threshold), thereby reducing the potential for a false trigger.

The N-1 key scan averaging (with baseline drift compensation) technique according to this Disclosure provides a number of advantages as a key-press processing technique for ToM apparatus. The key-press processing technique suppresses environmental noise and device temperatures drift, including for ToM inductive- or capacitive-sense ToM apparatus (such as key pads). The key-press processing technique reduces the number of false key-press conditions, such as due to human body capacitance and adjacent key deflection. Baseline normalization can be used to normalize for temperature drift. The N-1 key scan averaging (with baseline drift compensation) can be implemented with the example single-step increment/decrement technique.

The Disclosure provided by this Description and the Figures sets forth example embodiments and applications illustrating aspects and features of the invention, and does not limit the scope of the invention, which is defined by the claims. Known circuits, functions and operations are not described in detail to avoid obscuring the principles and features of the invention. These example embodiments and applications can be used by ordinarily skilled artisans as a basis for modifications, substitutions and alternatives to construct other embodiments, including adaptations for other applications.

The invention claimed is:

1. A method for use with an N-key touch input apparatus including a touch surface defining N touch keys each with an associated touch-key area, the touch surface overlying a key-matrix of N touch-key sense circuits, each associated with a respective touch-key area for a respective touch key, to provide a touch-key sense signal based on sensing the associated touch key, including sensing a key-press condition in response to depressing the associated touch-key area, the method comprising:
continuously scanning at a first bandwidth each of the N touch-key sense circuits of the key-matrix, and for each touch key:
determining a respective touch-key baseline sense signal, independent of a key-press condition; and
determining a respective touch-key baseline value based on successive touch-key baseline sense signals; and
during successive key-scan periods, scanning at a second bandwidth greater than the first bandwidth each of the N touch-key sense circuits of the key-matrix, and for each touch key:
determining a touch-key sense signal from an associated one of the N touch-key sense circuits;
averaging the touch-key baseline values for the other N-1 touch keys to generate a respective N-1 key-scan average value;
comparing the touch-key sense signal for the touch key to a key-press threshold value based on the N-1 key-scan average value for the other N-1 touch keys; and
signaling a key-press condition if the touch-key sense signal is greater in magnitude than the respective N-1 key-scan average value by the key-press threshold value.

2. The method of claim 1, wherein, during each key-scan period, for each touch key, generating a respective touch-key baseline value comprises generating a normalized touch-key baseline value, including suppressing offset.

3. The method of claim 2, wherein generating the normalized touch-key baseline value for each touch key comprises:
incrementing the touch-key baseline value if the touch-key sense signal is greater than the touch-key baseline value;
decrementing the touch-key baseline value if the touch-key sense signal is less than the touch-key baseline value; and
generating the normalized touch-key baseline value by subtracting the touch-key baseline value from the touch-key sense signal.

4. The method of claim 1, further comprising signaling a multi-touch condition for multiple key-press conditions.

5. The method of claim 1, wherein the baseline value corresponds at least in part to temperature drift.

6. A device including an N-key touch input apparatus, comprising:
a touch key apparatus including a touch surface defining N touch keys each with an associated touch-key area;
a key-matrix including N touch-key sense circuits, each associated with a respective touch-key area for a respective touch key, to provide a touch-key sense signal based on sensing the associated touch key;
a touch-key sensor unit coupled to the N touch-key sense circuits;
the touch-key sensor unit operable to continuously scan at a first bandwidth each of the N touch-key sense circuits of the key-matrix, and for each touch key:
to determine a respective touch-key baseline sense signal, independent of a key-press condition; and
to determine a respective touch-key baseline value based on successive touch-key baseline sense signals; and
the touch-key sensor unit operable, during successive key-scan periods, to scan at a second bandwidth greater than the first bandwidth each of the N touch-key sense circuits of the key-matrix, and for each touch key:
to determine a touch-key sense signal from an associated one of the N touch-key sense circuits;
to generate a respective N-1 key-scan average value based on averaging the touch-key baseline values for the other N-1 touch keys;
to compare the touch-key sense signal for the touch key to a key-press threshold value based on the N-1 key-scan average value for the other N-1 touch keys; and
to signal a key-press condition if the touch-key sense signal is greater in magnitude than the respective N-1 key-scan average value by the key-press threshold value.

7. The system of claim 6, wherein each generated touch-key baseline value is normalized to suppress offset.

8. The system of claim 6, wherein the touch-key sensor unit generates the touch-key baseline value for each touch key by:
incrementing the touch-key baseline value if the touch-key sense signal is greater than the touch-key baseline value;
decrementing the touch-key baseline value if the touch-key sense signal is less than the touch-key baseline value; and
generating the touch-key baseline value by subtracting the touch-key baseline value from the touch-key sense signal.

9. The system of claim 8, wherein each generated touch-key baseline value is normalized to suppress offset.

10. The system of claim 6, wherein the touch-key sensor unit is operable to signal a multi-touch condition for multiple key-press conditions.

11. The device of claim 6, wherein the baseline value corresponds at least in part to temperature drift.

12. A touch-key circuit for use in a touch-on-metal N-key input system that includes a touch surface defining N touch keys each with an associated touch-key area for a respective touch key, and a key-matrix including N touch-key sense circuits, each associated with a respective touch-key area to provide a touch-key sense signal based on sensing the associated touch key, the touch-key sensor unit comprising:
baseline scanning circuitry coupled to the N touch-key sense circuits of the key-matrix, and operable to continuously scan at a first bandwidth each of the N touch-key sense circuits, and for each touch key:
to determine a respective touch-key baseline sense signal, independent of a key-press condition; and to determine a respective touch-key baseline value based on successive touch-key baseline sense signals; and touch-key scanning circuitry coupled to the N touch-key sense circuits, and operable, during successive key-scan periods, to scan at a second bandwidth greater than the first bandwidth each of the N touch-key sense circuits of the key-matrix, and for each touch key:
to determine a touch-key sense signal from an associated one of the N touch-key sense circuits;
to generate a respective N-1 key-scan average value based on averaging the touch-key baseline values for the other N-1 touch keys;
to compare the touch-key sense signal for the touch key to a key-press threshold value based on the N-1 key-scan average value for the other N-1 touch keys; and
to signal a key-press condition if the touch-key sense signal is greater in magnitude than the respective N-1 key-scan average value by the key-press threshold value.

13. The circuit of claim 12, wherein each generated touch-key baseline value is normalized to suppress offset.

14. The circuit of claim 12, wherein the baseline scanning circuitry generates the touch-key baseline value for each touch key by:
incrementing the touch-key baseline value if the touch-key sense signal is greater than the touch-key baseline value;
decrementing the touch-key baseline value if the touch-key sense signal is less than the touch-key baseline value; and
generating the touch-key baseline value by subtracting the touch-key baseline value from the touch-key sense signal.

15. The circuit of claim 14, wherein each generated touch-key baseline value is normalized to suppress offset.

16. The circuit of claim 12, wherein the touch-key sensor circuit is operable to signal a multi-touch condition for multiple key-press conditions.

17. The circuit of claim 12, wherein the baseline value corresponds at least in part to temperature drift.

* * * * *